(12) United States Patent
Wood et al.

(10) Patent No.: US 6,757,093 B2
(45) Date of Patent: Jun. 29, 2004

(54) MEMS REFLECTORS HAVING TAIL PORTIONS THAT EXTEND INSIDE A RECESS AND HEAD PORTIONS THAT EXTEND OUTSIDE THE RECESS AND METHODS OF FORMING SAME

(75) Inventors: Robert L. Wood, Cary, NC (US); Vivek Agrawal, Durham, NC (US)

(73) Assignee: JDS Uniphase Corporation, San Jose, CA (US)

( * ) Notice: Subject to any disclaimer, the term of this patent is extended or adjusted under 35 U.S.C. 154(b) by 35 days.

(21) Appl. No.: 10/151,080

(22) Filed: May 20, 2002

(65) Prior Publication Data

US 2002/0171909 A1 Nov. 21, 2002

Related U.S. Application Data

(60) Provisional application No. 60/292,677, filed on May 21, 2001, and provisional application No. 60/318,324, filed on Sep. 12, 2001.

(51) Int. Cl.$^7$ .......................... G02B 26/00; G02B 6/26; H01L 21/00
(52) U.S. Cl. ...................... 359/291; 359/290; 359/280; 385/17; 438/52
(58) Field of Search ................................ 359/291, 290, 359/280; 385/17, 15, 16, 18, 19; 438/52; 257/415

(56) References Cited

U.S. PATENT DOCUMENTS

| | | | | |
|---|---|---|---|---|
| 4,317,611 A | * | 3/1982 | Petersen ..................... 359/214 |
| 5,191,251 A | * | 3/1993 | Paratte ........................ 310/309 |
| 5,867,297 A | | 2/1999 | Kiang et al. ................. 359/198 |
| 5,867,302 A | | 2/1999 | Fleming ...................... 359/291 |
| 5,914,801 A | | 6/1999 | Dhuler et al. ............... 359/230 |
| 5,920,417 A | | 7/1999 | Johnson ...................... 359/223 |
| 5,955,817 A | | 9/1999 | Dhuler et al. ............... 310/307 |
| 5,960,132 A | | 9/1999 | Lin ............................... 385/18 |
| 5,962,949 A | | 10/1999 | Dhuler et al. ............... 310/307 |
| 5,994,816 A | | 11/1999 | Dhuler et al. ............... 310/307 |
| 6,020,272 A | | 2/2000 | Fleming ...................... 438/734 |
| 6,023,121 A | | 2/2000 | Dhuler et al. ............... 310/307 |
| 6,040,935 A | | 3/2000 | Michalicek ................. 359/198 |
| 6,087,747 A | | 7/2000 | Dhuler et al. ................. 310/90 |
| 6,114,794 A | | 9/2000 | Dhuler et al. ............... 310/307 |
| 6,134,042 A | | 10/2000 | Dhuler et al. ............... 359/224 |
| 6,181,460 B1 | | 1/2001 | Tran et al. ................... 359/291 |
| 6,186,399 B1 | | 2/2001 | Stern et al. ............. 235/462.01 |
| 6,201,629 B1 | | 3/2001 | McClelland et al. ........ 359/223 |
| 6,256,430 B1 | | 7/2001 | Jin et al. ....................... 385/18 |
| 6,498,870 B1 | * | 12/2002 | Wu et al. ..................... 385/18 |
| 6,542,653 B2 | * | 4/2003 | Wu et al. ..................... 385/16 |
| 2002/0067533 A1 | * | 6/2002 | Sun et al. ................... 359/198 |

OTHER PUBLICATIONS

An et al., "Two–Input Axis Angular Rate Sensor," Part of the SPIE Conference on Smart Electronics and MEMS, SPIE vol. 3673, Mar. 1999, pp. 218–229.

Behin et al., *Magnetically Actuated Micromirrors for Fiber–Optic Switching*, Solid–State Sensor and Actuator Workshop, Hilton Head Island, SOuth Carolina, Jun. 8–11, 1998, pp. 273–276.

(List continued on next page.)

*Primary Examiner*—Timothy Thompson
(74) *Attorney, Agent, or Firm*—Myers Bigel Sibley & Sajovec, P.A.

(57) ABSTRACT

A MEMs structure can include a recess in a substrate, the recess having a side wall and a floor. A tail portion of a moveable reflector is on the substrate and extends beyond the side wall of the recess opposite the recess floor and is configured to rotate into the recess. A head portion of the moveable reflector extends on the substrate outside the recess.

24 Claims, 9 Drawing Sheets

OTHER PUBLICATIONS

Cowen et al., *Modeling of Stress–Induced Curvature in Surface–Micromachined Devices*, Microlithography and Metrology in Micromachining III, SPIE Proceedings, vol. 3225, Paper No. 3225–06, pp. 56–67.

David A. Koester et al., *MUMPs™ Design Handbook*, Revision 5.0, Published by Cronos Integrated Microsystems, 2000.

Field et al., *Micromachined 1X2 Optical Fiber Switch*, Solid–State Sensors and Actuators, 1995 and Eurosensors IX.. Transducers '95. The 8th International Conference on, vol.: 1, pp. 344–347.

Judy, *Magnetic Microactuation of Torsional Polysilicon Structures*, Sensors and Actuators A, vol. 53, 1996, pp. 392–397.

Judy, *Magnetically Actuated, Addressable Microstructures*, Journal of Microelectromechanical Systems, vol. 6, No. 3, Sep. 1997, pp. 249–255.

Kim et al., "Fabrication and Deflection Measurement of Micromirrors Supported by a S–shape Girder," Part of the SPIE Conference on Diffractive and Holographic Technologies, Systems, and Spatial Light Modulators VI, SPIE vol. 3633, Jan. 1999, pp. 138–147.

Marxer et al., *Vertical Mirrors Fabricated by Reactive Ion Etching for Fiber Optical Switching Applications*, Tenth IEEE International MEMS Workshop, 1997, pp. 349–354.

Smith, *Modern Optical Engineering*, McGraw–Hill, 1996, pp. 176.

Wu et al., "Micromechanical Photonic Integrated Circuits," IEICE Trans Electron, vol. E83–C, No. 6, Jun. 2000, pp. 903–911.

Yi et al., *Magnetic Actuation of Hinged Microstructures*, IEEE Journal of Microelectromechanical Systems, vol. 8, No. 1, Mar. 1999, pp. 10–17.

Yi et al., *Parallel Assembly of Hinged Microstructures Using Magnetic Actuation*, Solid–State Sensor and Actuator Workshop, Hilton Head Island, South Carolina, Jun. 8–11, 1998, pp. 269–272.

\* cited by examiner

MEMS REFLECTORS HAVING TAIL PORTIONS THAT EXTEND INSIDE A RECESS AND HEAD PORTIONS THAT EXTEND OUTSIDE THE RECESS AND METHODS OF FORMING SAME

CLAIM FOR PRIORITY

The present application claims priority to U.S. Provisional Patent Application No. 60/292,677 filed May 21, 2001 and to U.S. Provisional Patent Application No. 60/318,324 filed Sep. 12, 2001, the entireties of which are hereby incorporated herein by reference.

FIELD OF THE INVENTION

The present invention relates to the field of optical switching in general and more particularly, to MicroElectroMechanical systems (MEMS) used in optical switching.

BACKGROUND OF THE INVENTION

MicroElectroMechanical systems (MEMS) and devices have been recently developed as alternatives for conventional electromechanical devices, in-part because MEMS devices are potentially low cost, due to the use of simplified microelectronic fabrication techniques. New functionality may also be provided because MEMS devices can be much smaller than conventional electromechanical systems and devices.

In the area of optical switching, MEMS technology has been used to fabricate optical switches using MEMS reflectors, such as mirrors, to switch inputs thereto to selected outlets. Some MEMS reflectors in optical switches are moveable to provide the desired switch functions. For example, when a moveable reflector is moved to a reflecting position along an optical path, optical radiation that is conducted along the optical path can be reflected by the moveable reflector. When the moveable reflector is moved to a non-reflecting position outside the optical path, the moveable reflector may not reflect optical radiation from the optical path. Accordingly, moveable reflectors in optical switches can be positioned in reflecting or non-reflecting positions so that the optical switch can provide the desired switch functions.

It is known to fabricate "pop-up" MEMS reflectors to provide the moveable reflectors discussed above. For example, some pop-up reflectors have a non-reflecting position wherein the moveable reflector is positioned horizontally on an underlying substrate. When the moveable reflector is moved to the reflecting position, the moveable reflector rotates off the substrate (i.e., pops-up) to intersect the optical path. This type of pop-up reflector is described in further detail in U.S. application Ser. No. 09/489,264 to Wood et al., entitled *MEMS Optical Cross-Connect Switch*.

In some MEMS devices using pop-up reflectors, the pop-up reflectors are aligned in the up position using a "Bed Of Nails" (BON) structure. The BON can provide an alignment structure so that when the pop-up reflector is moved to the up position, the pop-up reflector is accurately aligned to the optical path. In some MEMS devices, the BON is assembled with the underlying substrate including the pop-up reflectors. For example, the BON can be attached to the underlying substrate from above. Moreover, the BON is sometimes fabricated using relatively exotic starting material and may use Deep Reactive Ion Etching (DRIE) which can increase the costs associated with fabrication. The individual posts (or nails) in BON may also obscure some of the reflectors thereby increasing the difficulty to test and characterize the device.

In other types of MEMS devices, moveable reflectors are aligned without the use of the BON type structures described above. For example, in some types of MEMS, devices the moveable reflectors are moved over a relatively small angular range (i.e., less than 90 degrees) to different reflecting position. Such moveable reflectors can require relatively accurate positioning of the moveable reflector over the angular range. These types of moveable reflectors are discussed further in U.S. patent application Ser. No. 09/860,855, which is commonly assigned to the present assignee, Filed May 18, 2001 entitled *Microelectromechanical Apparatus with Tiltable Bodies Including Variable Tilt-Stop Engaging Portions and Methods of Operation and Fabrication Therefor*, the entire disclosure of which is hereby incorporated herein by reference.

It is known to control the angular position of the reflectors using voltages applied to planar control electrodes in the substrate and on the moveable reflector. A voltage applied across the planar electrodes can be used to develop an electrostatic force to control the position of the moveable reflector. Unfortunately, the electrostatic forces needed to position the moveable reflector can require relatively high voltages. For example, in some devices, voltages in excess of 150 Volts may be needed to accurately control the position of the moveable reflector. The use of such high voltages can increase the cost of MEMS devices due to the relative lack of availability of multi-port high voltage driver integrated circuits. Furthermore, the use of such high voltages can contribute to dielectric breakdown due to the relatively thin layers typically used in MEMS fabrication. Moreover, the use of planar electrodes for these types of moveable reflectors may require relatively large inter-electrode spacing which can reduce the "fill factor" associated with the MEMS device.

SUMMARY

Embodiments according to the present invention can provide MEMS structures and methods of forming MEMS structure. Pursuant to some embodiments, a MEMS structure can include a recess in a substrate, the recess having a side wall and a floor. A tail portion of a moveable reflector is on the substrate and extends beyond the side wall opposite the recess floor and is configured to rotate into the recess. A head portion of the moveable reflector extends on the substrate outside the recess.

In some embodiments according to the present invention, the MEMS structures can include a latch member on the substrate that extends, opposite the floor, beyond a second portion of the side wall opposite the first portion of the side wall. The latch member holds the head away from the substrate to define a wedge shaped gap between the head and the substrate opposite the head.

In some embodiments according to the present invention, the moveable reflector is configured to rotate to a reflecting position wherein the tail contacts the side wall and the head is aligned with an optical radiation path parallel to the substrate in response to a magnetic force.

In some embodiments according to the present invention, the surface of the tail that contacts the side wall includes at least one raised structure thereon that keeps an adjacent portion of the surface from contacting the side wall.

In other embodiments according to the present invention, the moveable reflector pivots on the side wall and is cantilevered thereon to define a neutral position that avoids contact with the substrate. In some embodiments according to the present invention, a latch member extends from the side wall opposite the moveable reflector and contacts a portion of the moveable reflector to bias the moveable reflector into the neutral position. In some embodiments according to the present invention, the neutral position defines a non-parallel shaped gap between the moveable reflector and the substrate. In some embodiments according to the present invention, the non-parallel shaped gap comprises a wedge shaped gap.

Pursuant to method embodiments according to the present invention, a MEMS structure can be formed by forming a recess in a substrate, the recess having a side wall and a floor. A moveable reflector having a tail portion is formed on the substrate extending beyond the side wall opposite the recess floor and having a head portion extending on the substrate beyond the side wall outside the recess.

In some embodiments according to the present invention, a hinge is formed coupled to the moveable reflector and to the side wall to define an axis about which the moveable reflector is configured to rotate in a first direction into the recess to move the tail towards the side wall and to rotate in a second direction out of the recess to move the tail away from the side wall.

In some embodiments according to the present invention, a latch member is formed on the substrate extending, opposite the floor, beyond a second portion of the side wall opposite the first portion of the side wall. The latch member holds the head away from the substrate to define a wedge shaped gap between the head and the substrate opposite the head.

DETAILED DESCRIPTION OF EMBODIMENTS ACCORDING TO THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the size of regions and elements therein may be exaggerated for clarity. Like numbers refer to like elements throughout.

It will be understood that when an element such as a layer, region, substrate or reflector is referred to as being "on" another element, it can be directly on the other element or intervening elements may also be present. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the term "optical radiation" can include radiation that can be used to transmit data in a communications system, such as radiation in the visible, ultraviolet, infrared and/or other portions of the electromagnetic radiation spectrum. Although the present invention is described herein by reference to MEMS actuators, it will be understood that the present invention may be utilized with other actuators. As used herein, the term optical "switch" can include optical devices that function as multiplexers, demultiplexers, and switches.

Figure 1A:
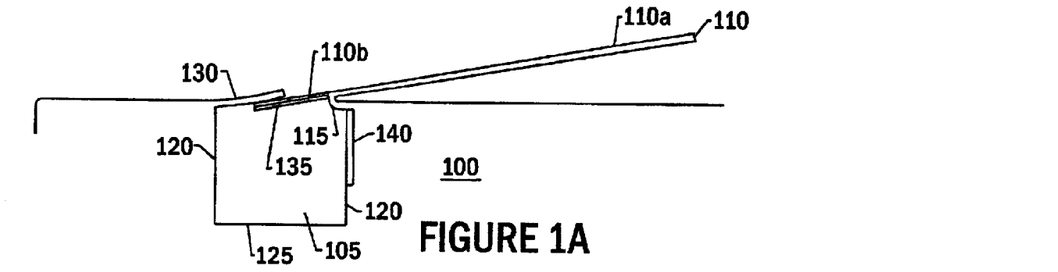
FIGS. 1–2 are cross-sectional schematic views illustrating moveable reflectors according to some embodiments of the present invention.
Figures 1B, 1C, 2A, 2B:
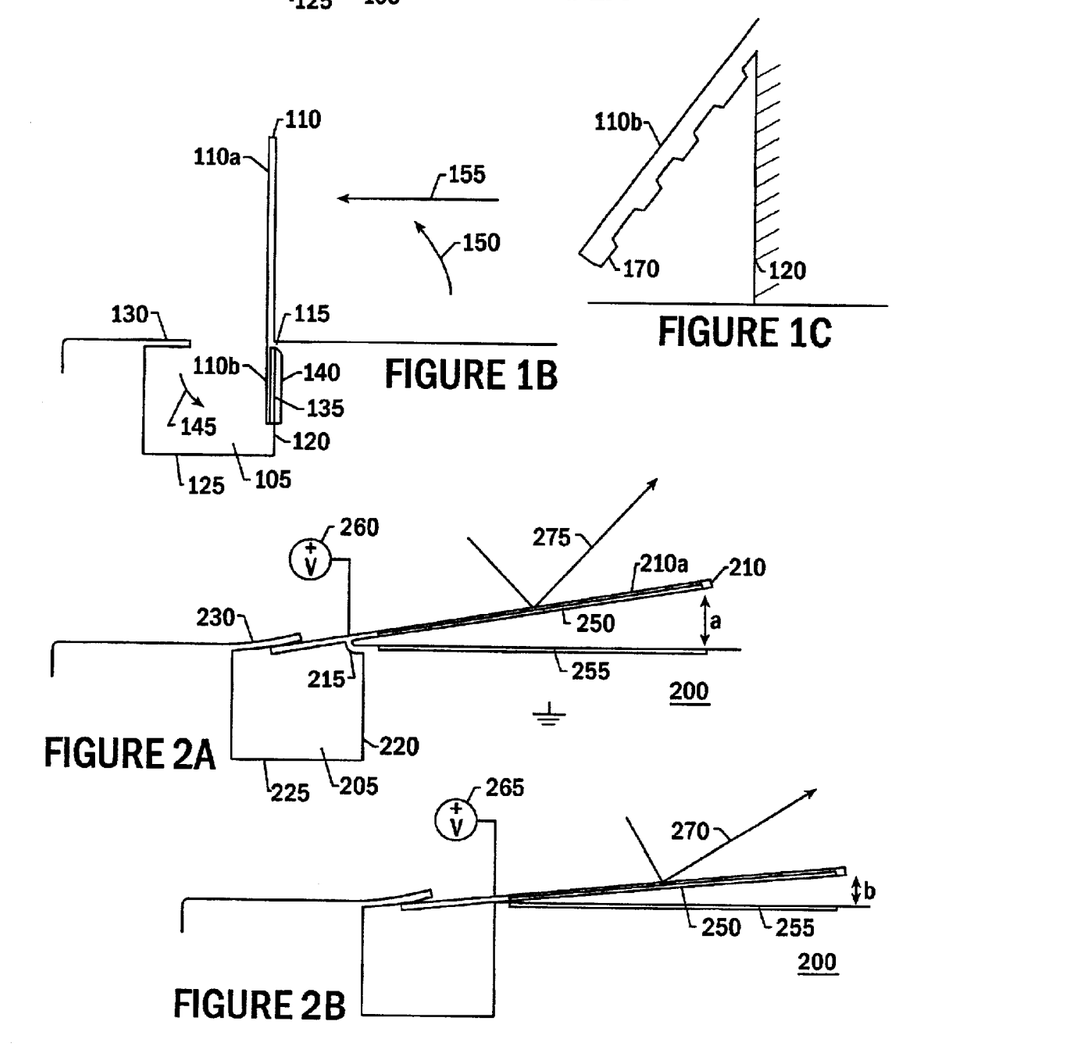

According to embodiments of the present invention, as illustrated in FIGS. 1A and 1B, a moveable reflector 110 is on a substrate 100. The moveable reflector 110 includes a head portion 110A and a tail portion 110B which are spaced apart from one another. The substrate has a recess 105 formed therein. The recess 105 has a side wall 120 and a floor 125. The moveable reflector 110 is moveably coupled to the side wall 120 by a hinge 115. The moveable reflector 110 rotates on the hinge 115 about an axis defined therethrough. Although the terms "head" and "tail" are used to describe portions of the moveable reflectors disclosed herein, it will be understood that, as used herein, the terms "head" and "tail" describe first and second portions of the moveable reflector that are separated from one another and are not necessarily limited to opposing end portions of the moveable reflector.

Although the side wall 120 is shown as a continuous vertical surface, it will be understood the side wall 120 is intended to provide a structure for vertical alignment of the reflector 110. Accordingly, other structures, such as a vertical ledge, could be formed as part of a larger non-vertical side wall.

It will also be understood that in other embodiments according to the invention, the recess may be defined by a window on a layer formed on the substrate. The window may, therefore, provide an edge or step on which the moveable reflector can pivot. Accordingly, as used herein, the term "substrate" includes structures having multiple layers.

The tail portion 110B extends on the substrate beyond the side wall 120 opposite the recess floor and is configured to rotate into the recess 105 on the hinge 115 towards the side wall 120. The head portion 110A extends on the substrate outside the recess and is configured to rotate away from the substrate 100 as the tail portion 110B rotates into the recess 105. Accordingly, the moveable reflector "pivots" on the upper edge of the side wall 120 which acts as a fulcrum for the moveable reflector 110.

A latch member 130 extends on the substrate beyond a portion of the side wall 120 which is opposite from the portion of the side wall 120 from which the tail 110B extends. The latch member 130 extends beyond the side wall 120 far enough to contact the tail 110b as shown in FIG. 1A. In particular, a surface of the latch member 130 that faces the floor 125 contacts a surface of the tail 110B that faces away from the floor 125.

The latch member 130 applies a force to the tail 110B which opposes a force applied by the hinge 115. The force applied by the hinge 115 causes the head 110A to move towards the substrate 100. The force applied by the latch member 130 opposes the hinge force to position the head 110A in a neutral position so that the moveable reflector 110 defines a non-parallel shaped gap with the substrate 100. It will be understood that the neutral position for the moveable reflector 110 is defined as an equilibrium point between the force applied by the latch member 130 and the opposing force applied by the hinge 115 and the absence of any other forces applied by the MEMS structure to the moveable reflector 110. It will be further understood that the non-parallel shaped can include any shape which defines a non-parallel gap, such as a wedge shown in FIG. 1.

Accordingly, the moveable reflector can be actuated starting from the neutral position to either an "up position", as shown for example in FIG. 1B, or in a down position, such as closer to the substrate 100, as shown for example, in FIG. 2. In any case, the opposing forces applied by the latch member 130 and the hinge 115 can establish the neutral position such that the head portion 110A does not contact the substrate 100 when other forces used to actuate the moveable reflector (such as electrostatic forces or magnetic forces) are removed.

As shown in FIG. 1B the moveable reflector 110 can rotate in the direction 150 to the up position so that the head 110A is aligned with an optical path 155. As the moveable reflector 110 rotates in the first direction 115, the tail 110B rotates in an opposite direction 145 into the recess 105 so that a surface of the tail 110b that faces the floor 125 in FIG. 1A contacts the side wall 120.

In some embodiments according to the present invention, the surface of the tail portion 110B which contacts the side wall 120 can include a first electrode 135 which is aligned with a second electrode 140 that is on the side wall 120 opposite the first electrode 135. A voltage can be applied across the first and second electrodes 135, 140 to electrostatically latch the moveable reflector 110 in the up position.

It will be understood that the electrodes described herein can be separate structures formed in or on the substrate (or other structures). Alternatively, in other embodiments according to the invention, the electrodes can be provided by the substrate itself and, therefore, may not be structures that are separate from the substrate, or other structures, such as the moveable reflector.

As shown in FIG. 1C, at least one raised structure 170 can be formed on the surface of the tail that contacts the side wall. The raised structure is raised relative to the adjacent surfaces of the tail. The raised structure can electrically insulate the first and second electrodes 135, 140.

When the moveable reflector 110 is latched in the up position, a magnetic field used to move the moveable reflector 110 to the up position may be removed without causing the moveable reflector 110 to return to the down position (i.e., the moveable reflector 110 remains in the up position).

It will be understood that a surface of the head 110A which faces the substrate can also include an electrode which opposes an electrode that is on the substrate 110. These electrodes can be used to latch the moveable reflector 110 in the down position to resist the application of a magnetic field. For example, in an array of moveable reflectors 110 according to embodiments of the present invention, all of the moveable reflectors 110 that are to remain in the down position may be latched in the down position using electrostatic forces, whereas the moveable reflector 110 that is to be moved to the up position is not latched. Upon the application of a magnetic field, only the moveable reflector 110 that does not have latching voltage applied is rotated to the up position.

In some embodiments according to the present invention illustrated in FIG. 2, a moveable reflector 210 can be moved towards a substrate 200 to vary the size of the wedge shaped gap defined by the neutral position of the moveable reflector 210. In particular, a surface of a head 210A of the moveable reflector 210 that faces the substrate 200 includes a first electrode 250. A second electrode 255 is positioned opposite the first electrode 250 on the substrate 200. A voltage 260 can be applied to the first electrode 250 with respect to the second electrode 255 (which may be held, for example, at 0.0 volts or ground relative to the first voltage 260). The applied voltage 260 causes an electrostatic attraction between the first and second electrodes 250, 255 thereby causing the head 210A to move closer to the substrate 200. The addition of the electrostatic force resulting from the voltage 260 has the effect of adding to the force applied by a hinge 215 which is opposed by a force associated with a latch member 230.

The wedge shaped gap can reduce the voltage needed to actuate the moveable reflector. In particular, the wedge shaped gap can apply relatively high torque to portions of the moveable reflector that are located closer to the hinge due to the smaller size of the gap compared to the size farther away from the hinge. The ability to use lower voltages can, therefore, reduce the need for integrated circuits that provide higher voltages such as those which may be needed by conventional structures.

As shown in FIG. 2B, as the voltage 265 increases relative to the substrate 200, the moveable reflector 210 moves towards the substrate 200, thereby reducing the size of the wedge shaped gap from a to b as shown in FIGS. 2A and 2B. The moveable reflector 210 may, therefore, be moved from a first reflecting position to a second reflecting position such that optical radiation can be redirected from a first optical path 275 along a second optical path 270 that is offset from the first optical path 275.

Figure 5:
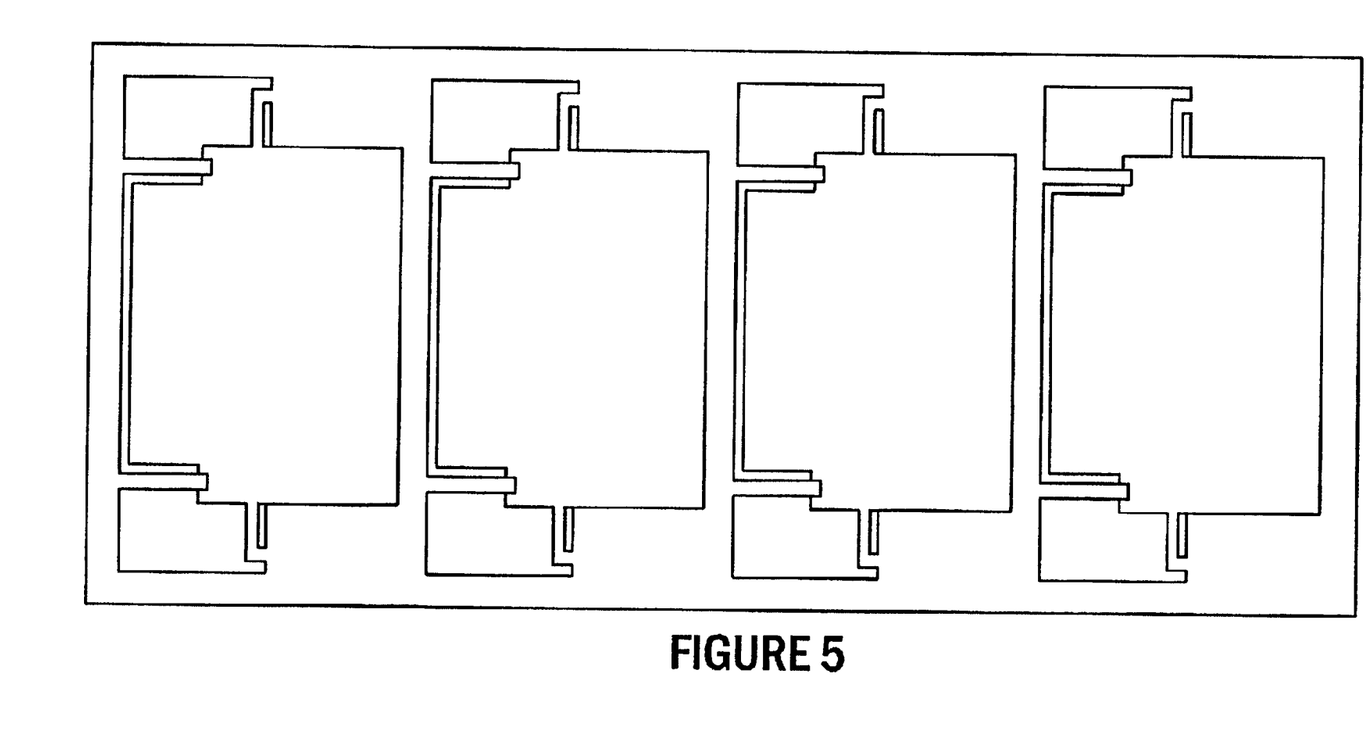
FIG. 5 is a plan view of a 1×4 optical switch array including moveable reflectors according to some embodiments of the present invention.

It will be understood that moveable reflectors according to embodiments of the present invention can be used in optical switching arrays. For example, as shown in FIG. 5, moveable reflectors according to the present invention are arranged to provide a 1×4 optical switching array. Optical switching array including embodiments according to the present invention can enable closer spacing of reflectors thereby providing increased fill-factors compared to conventional arrays. The closer spacing may be achieved by the wedge shaped electrodes as discussed in embodiments according to the invention.

Figure 3:
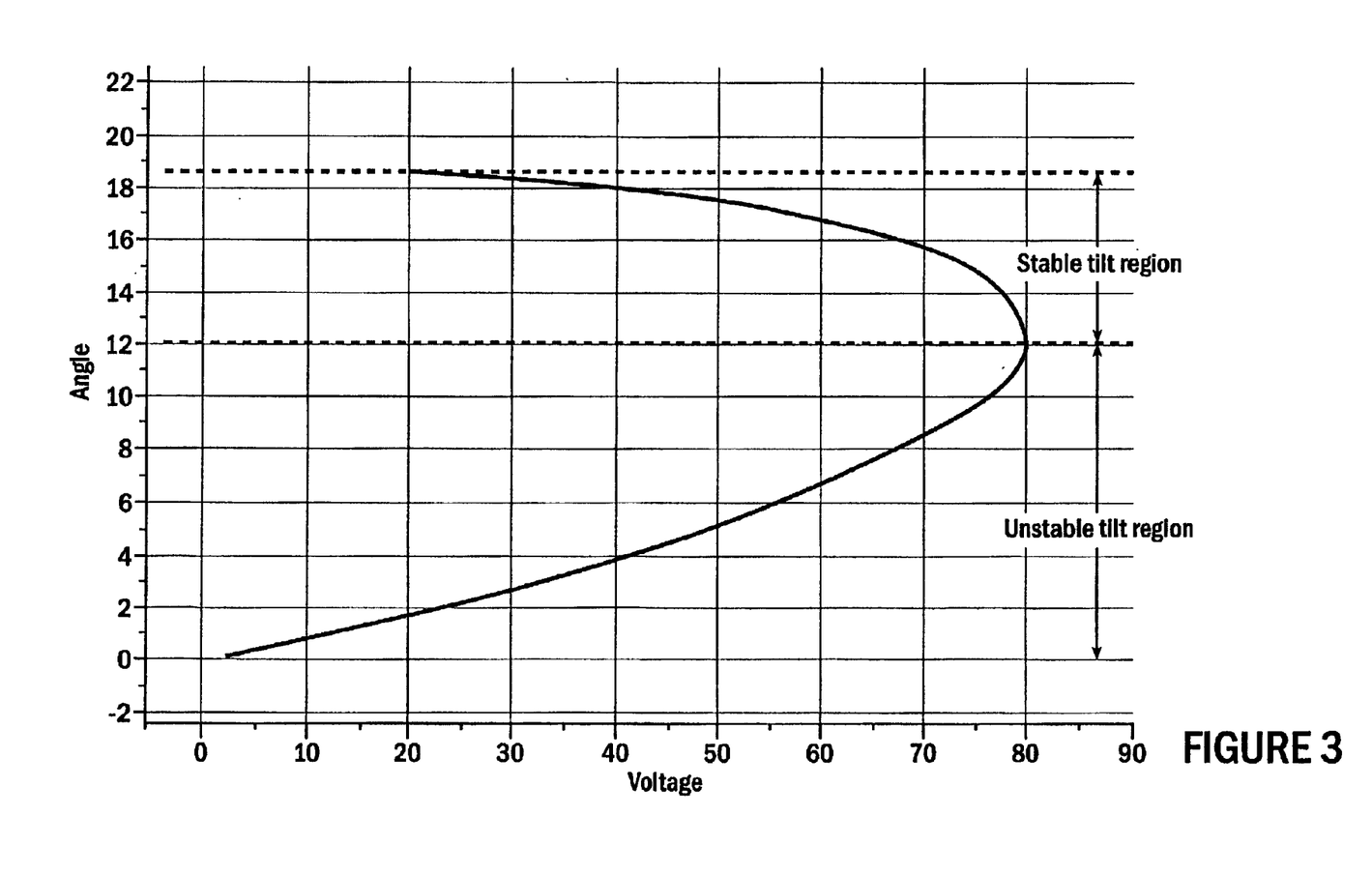
FIG. 3 is a graph that illustrates a simulation of a range over which accurate control of a moveable reflector in exemplary embodiments according to the present invention can be maintained.

FIG. 3 is a graph that illustrates a simulation of a range over which accurate control of a moveable reflector in exemplary embodiments according to the present invention can be maintained. The simulation results shown in FIG. 3 assume a structure having three latch members each having a modulus 385 GPa, a width of ten microns, a thickness of 0.7 microns and a length of 50 microns. The hinge is assumed to have a modulus of 385 GPa (i.e. equal to the modulus of the latch member) and a Poisson's ratio of 0.24, a thickness of 0.7 microns, a width of 10 microns and a length of 100 microns. The moment from the axis is assumed to be 50 microns and the reflector thickness is assumed to be 20 microns. The properties associated with the electrostatic force are assumed to be: an oxide thickness of 0.5 microns, a nitride thickness of 0.7 microns, a mirror width of 600 microns, and a mirror length of 600 microns. The simulation was performed using 100 increments for the range of the angle between the moveable reflector and the substrate.

As shown in FIG. 3, the moveable reflector is accurately controllable over a range defined by a first position that defines an angle between the moveable reflector and the substrate of about an 18 degrees and a second position that defines an angle between the moveable reflector and the substrate of about a 12 degrees using a voltage in the range between about 20–80 Volts. Beyond 80 volts the moveable reflector "snaps down" to the substrate.

In comparison, conventional devices may require voltages in excess of 150 Volts. Therefore, according to the simulation results shown in FIG. 3, embodiments according to the present invention can be accurately positioned over a wide range of angles using relatively low voltages.

Figure 4A:
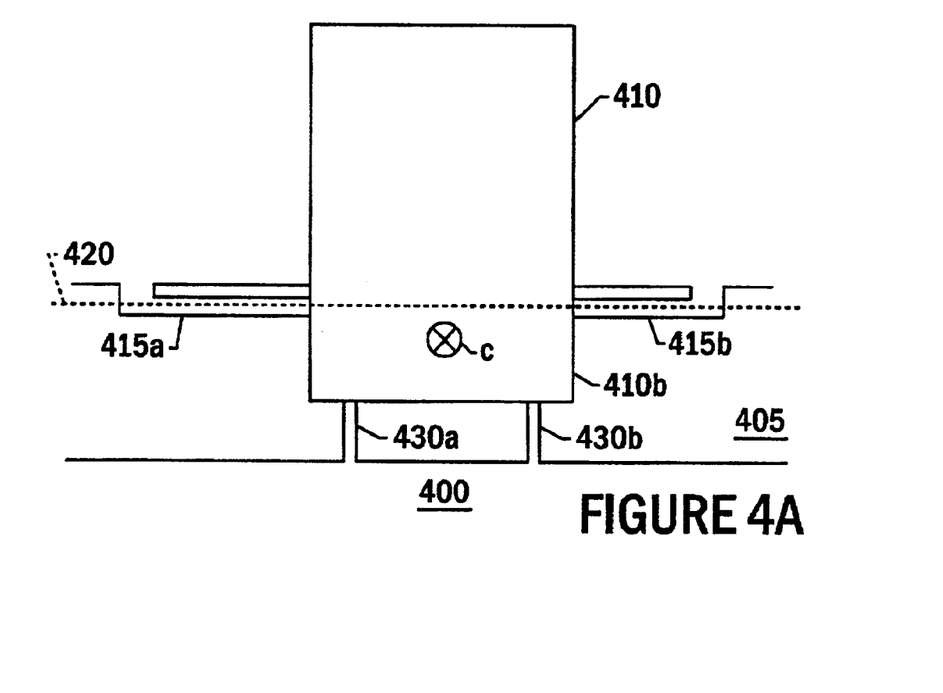
FIGS. 4A and 4B are plan views illustrating moveable reflectors according to some embodiments of the present invention during a set-up phase.
Figure 4B:
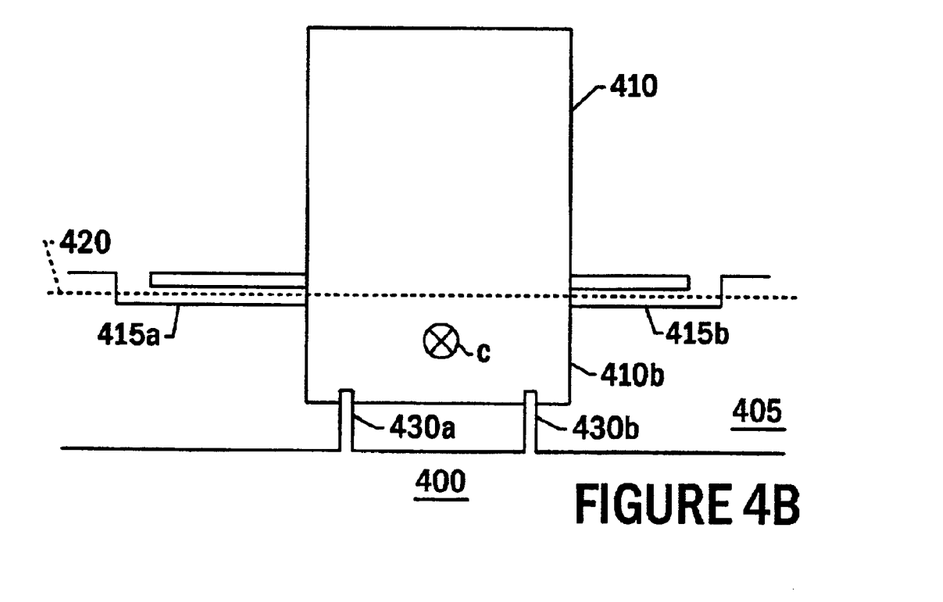

FIGS. 4A and 4B illustrate the set-up of latch members 430A, B relative to a moveable reflector 410 during fabrication. In particular, a hinge 415a,b and the latch members 430A, B are formed from the same layer/material during manufacturing. After the moveable reflector 410 is released from the substrate, a probe contacts a tail portion 410B of the moveable reflector at a contact point C located between an axis 420, defined by first and second hinges 415A, B, about which the moveable reflector 410 rotates and the ends of the latch members 430A, B thereby pushing the tail 410B past the latch members 410A,B into a recess 405. Pushing the tail 410B past the latch members 430A, B establishes the neutral position for the moveable reflector 410 relative to the substrate 400.

Figure 6:
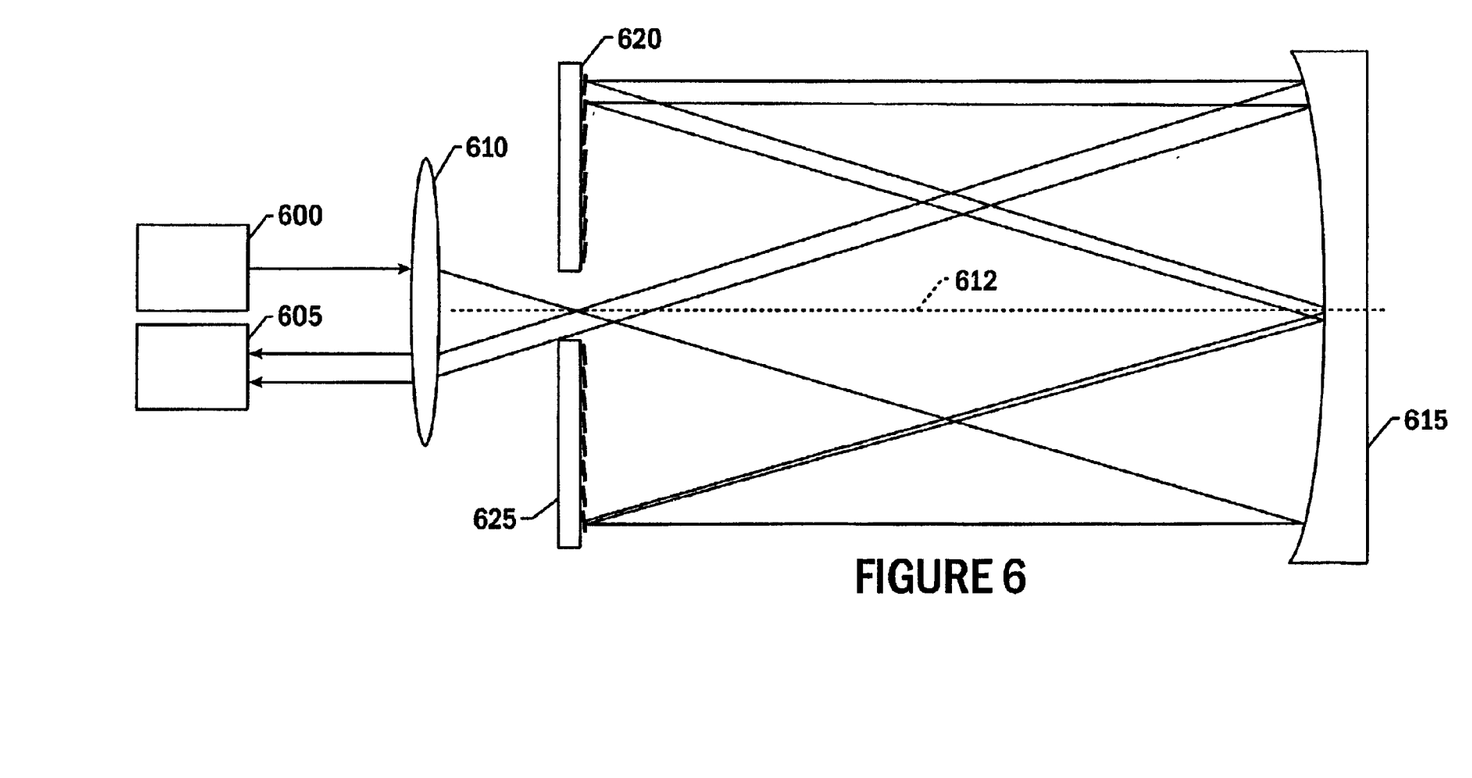
FIG. 6 is a schematic view of an ATO optical switch including moveable reflectors according to some embodiments of the present invention.

FIG. 6 illustrates an Angle-To-Offset (ATO) type switch using first and second opposing arrays of moveable reflectors according to the present invention. In particular, optical radiation is provided to the ATO switch by an array of input fibers 600 along an input optical path to a relay lens 610. The relay lens defines a central optical axis 612. The relay lens 610 redirects optical radiation across the central optical axis 612 to an ATO lens 615 having a concave surface that faces the relay lens 610. The optical radiation redirected by the relay lens 610 is reflected to a first one of the opposing moveable reflector arrays 625 along a path that is parallel to the central optical axis 612. The moveable reflector array 625 reflects the optical radiation back to the ATO lens 615 which in turn reflects the optical radiation towards the second opposing moveable reflector array 620. The second moveable reflector array 620 reflects the optical radiation back to the ATO lens 615 along a path that is parallel to the central optical axis 612. The ATO lens 615 redirects the optical radiation from the second moveable reflector array 620 back across the central optical axis 612 to the relay lens 610 which redirects the optical radiation to an array of output fibers 605.

As shown in FIG. 6, the moveable reflectors in each of the opposing moveable reflector arrays 625, 620 are angled towards the central optical axis 612. The angle of each of the reflectors of the moveable arrays, 620, 625 can be provided by the neutral position discussed herein. In some embodiments according to the present invention, the moveable reflectors in the opposing arrays can be changed.

The geometry of the latch member and the point at which the latch member contacts the tail determines the force that opposes the force applied by the hinge. Similarly, the geometry and placement of the hinge determines the force applied to the moveable reflector causing the head to rotate towards the substrate. Accordingly, the geometry and placement of the latch member and the hinge may be varied to define the neutral position of the moveable reflector. Moreover, since the hinge and the latch member are formed from the same layer/material and have similar geometric stiffness sensitivities a high degree of accuracy may be achieved for moveable reflectors within the same array. It will be understood that other neutral positions and ranges of angles may be achieve by using different parameters for the hinge and the latch members.

Figure 7:
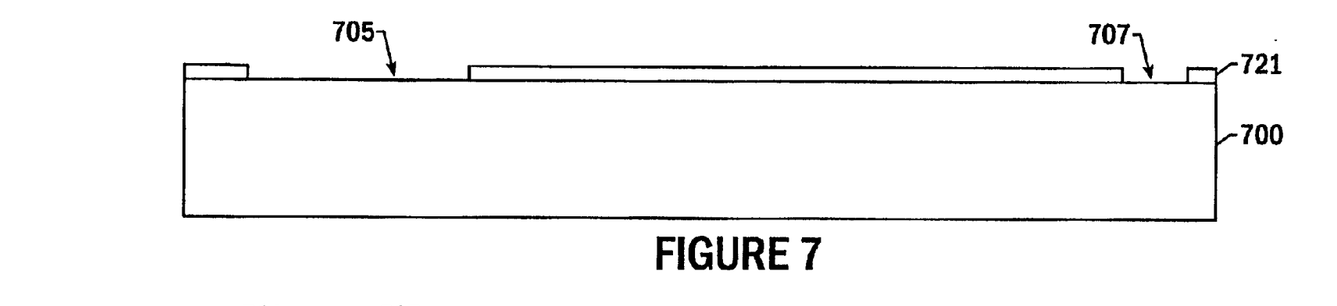
FIGS. 7–15 are cross-sectional views illustrating method of forming moveable reflectors according to some embodiments of the present invention.

FIGS. 7–15 are cross-sectional views of forming moveable reflectors according to some embodiment of the present invention. In particular, FIG. 7 shows that an oxide pattern 721 is deposited and patterned on a substrate 700. The oxide is patterned to expose underlying portions of the substrate 700 through window 705 and through a window 707 to allow for electrical contact to the substrate 700. It will be understood that the mask used to pattern the oxide 721 is a <110> alignment mask to promote etching of the substrate 700 along a crystallographic plane.

Figure 8:
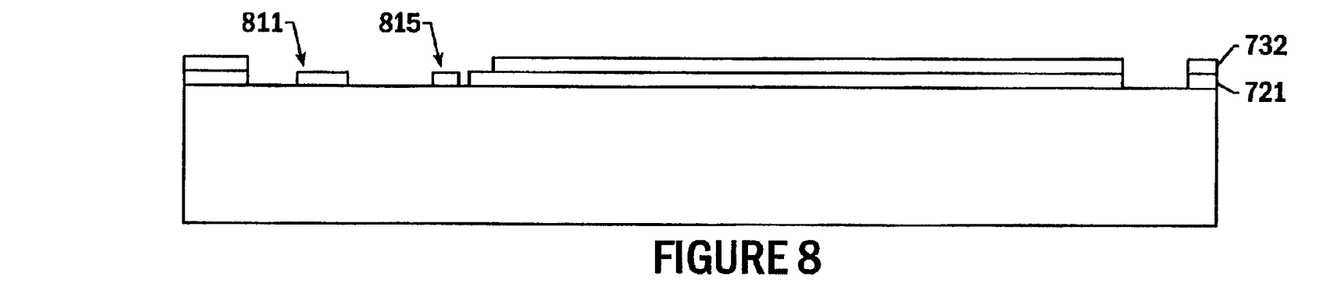

As shown in FIG. 8, a nitride layer 732 is deposited on the oxide layer 721 and is patterned to form a dielectric pad 811 on a surface of a tail of the moveable reflector which is figured to contact the side wall of the recess formed in a later step. The dielectric pad 811 can electrically insulate an electrode in the tail from an opposing electrode located in the side wall of the recess. The nitride layer 732 is also patterned to form a hinge 815 on which the moveable reflector rotates into the recess.

Figure 9:
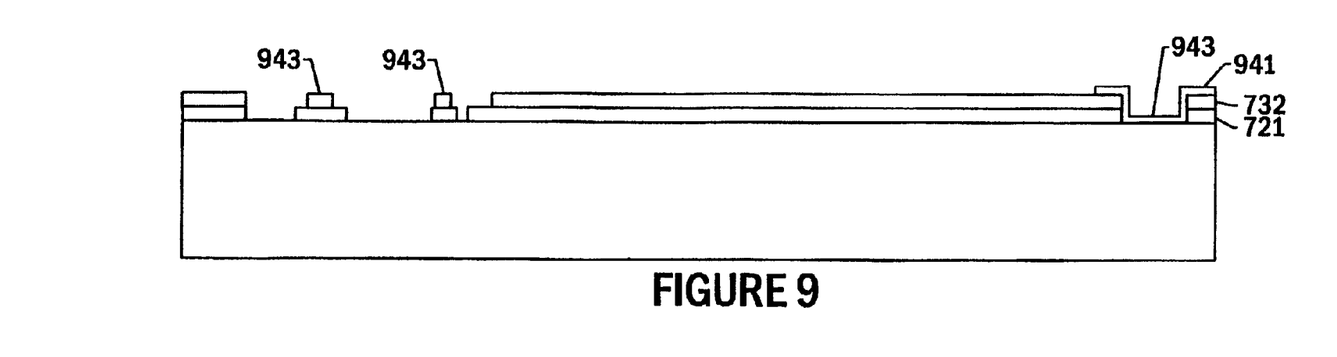

As shown in FIG. 9, a Cr/Au layer 941 is deposited on the nitride layer 732 to form Cr/Au traces 943 on the dielectric pad 811, the hinge 815, and in the contact 707. The Cr/Au pattern can provide electrical contacts to the electrodes in the moveable reflector to provide the voltages used to develop the electrostatic forces.

Figure 10:
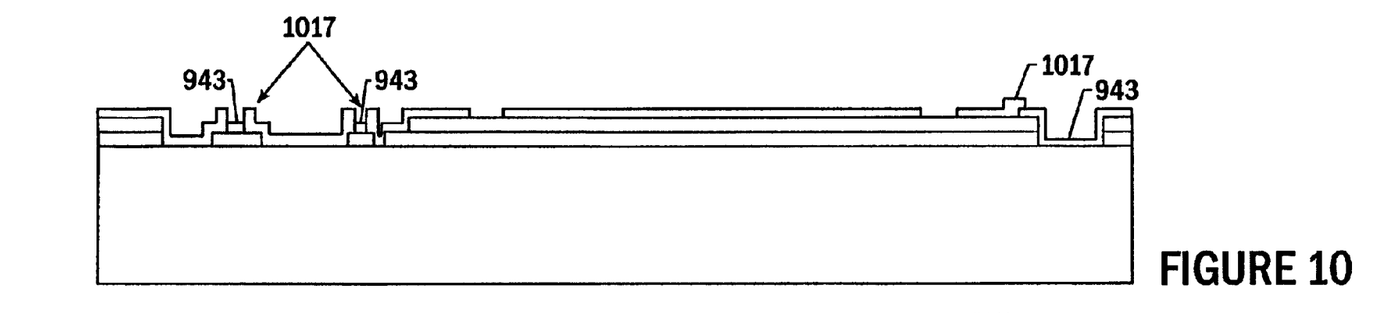
Figure 11:
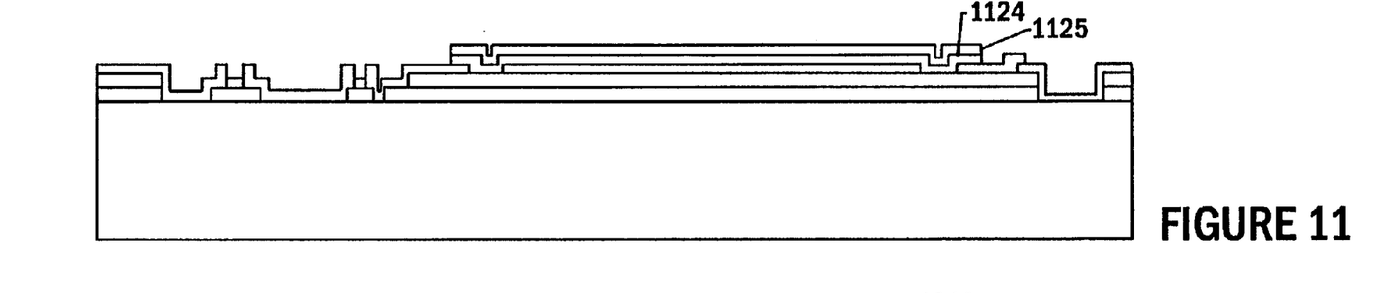
Figure 12:
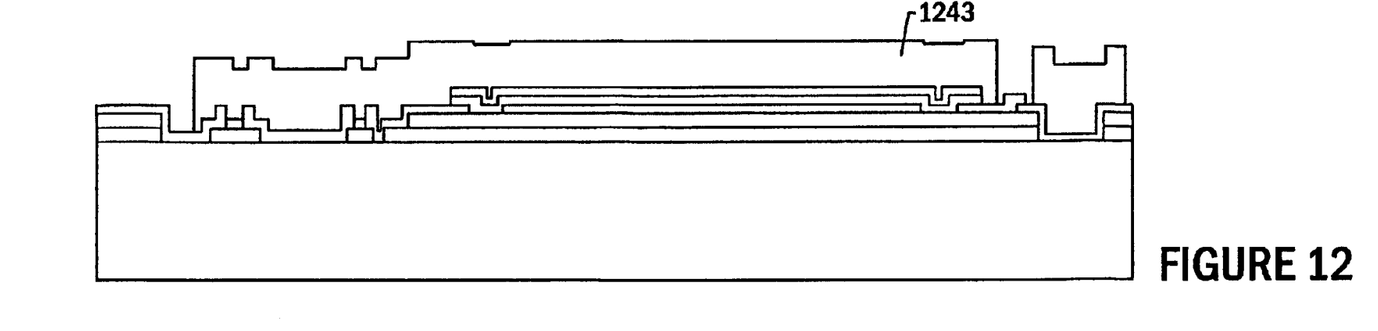

As shown in FIG. 10, a copper layer 1017 is deposited on the entire surface and is patterned to overlap the Cr/Au patterns 943. In FIG. 11, a Ti layer 1124 is deposited on a region of the copper layer 1017 which is later used to form the reflective surface of the moveable reflector. An Au layer 1125 is formed on the Ti layer 1124 to provide the reflective surface of the moveable reflector formed in a subsequent step. As shown in FIG. 12, nickel is electroplated onto the surface to form the moveable reflector 1243 prior to being released from the substrate.

Figure 13:
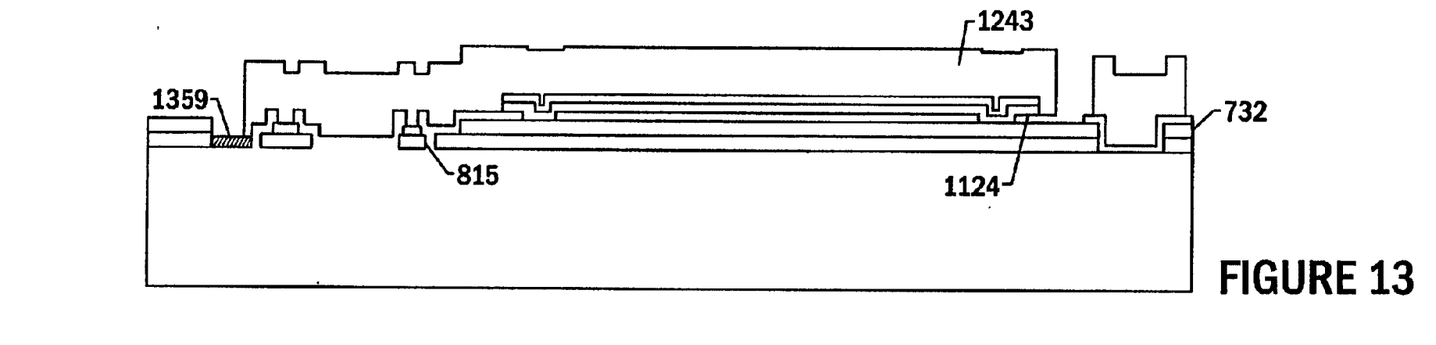

As shown in FIG. 13, the copper layer 1017 is etched from between the nitride layer 732 and the Ti layer 1124. It will also be understood that a latch member 1359 is formed opposite the hinge to extend beyond the side wall of the recess to be formed in a subsequent step. The latch member 1359 contacts an under side of the tail of the moveable reflector which is configured to rotate into the recess. As discussed above, during an initial set-up step in fabrication of the moveable reflector, the tail is pushed past the latch member to set the moveable reflector in the neutral position defined by the parameters associated with the hinge and the latch member.

Figure 14:
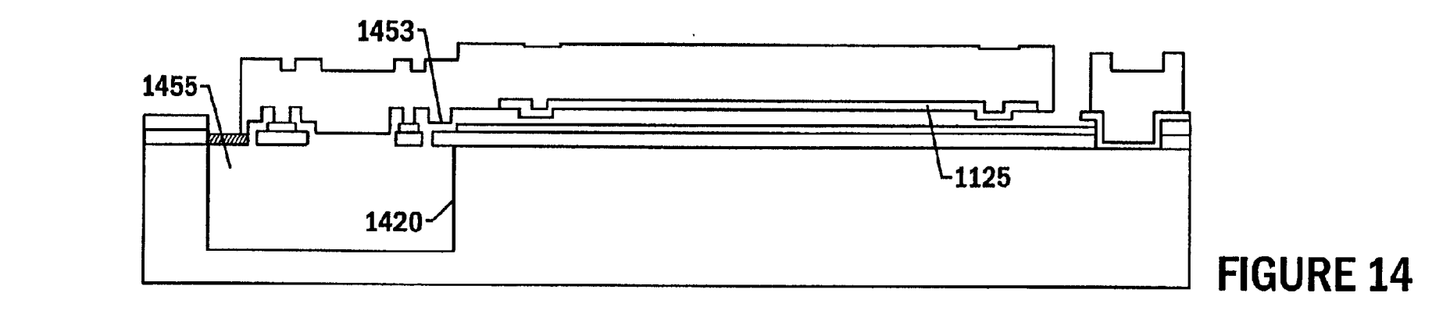
Figure 15:
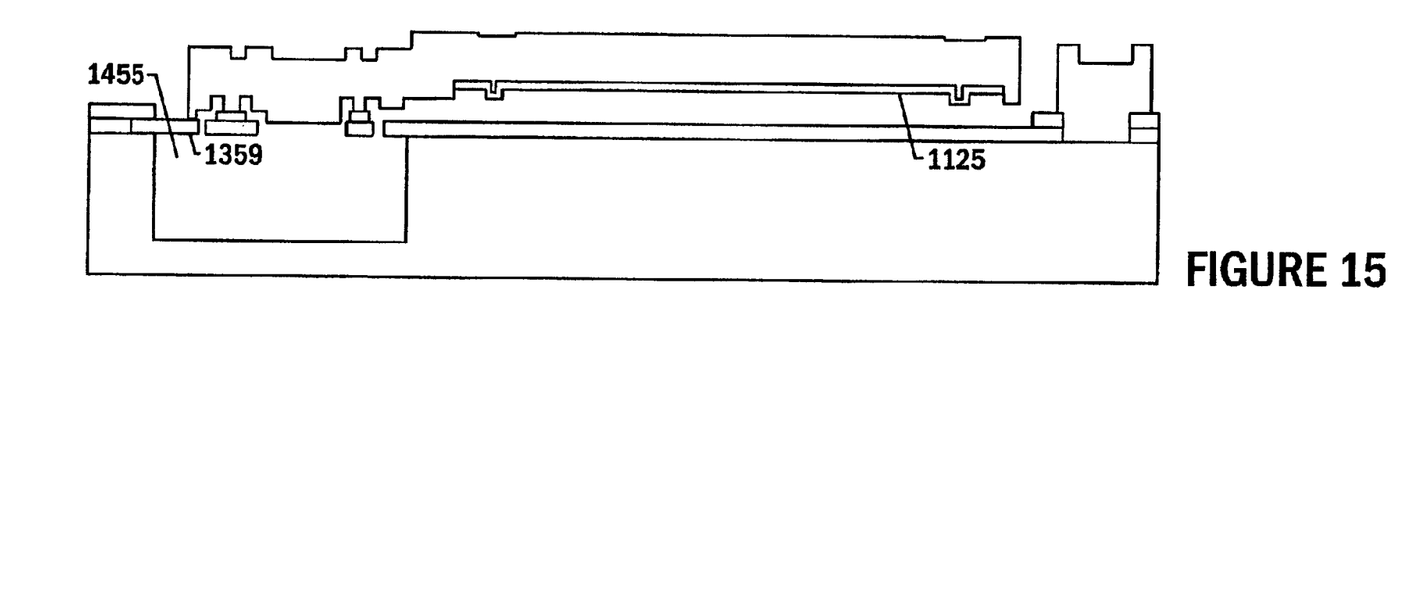

As shown in FIG. 14, the substrate 700 is etched using anisotropic etching to form a recess 1455 having a side wall 1420. A portion of the oxide layer 721 extends beyond the side wall 1420 to form an oxide lip 1453 which is removed in a subsequent step. As shown in FIG. 15, the oxide lip 1453 is removed by etching thereby releasing the moveable reflector from the substrate to allow the moveable reflector to rotate on the hinge into the recess 1455.

It will be understood that using electroplated nickel to form the moveable reflector allows the recess 1455 to be formed using anisotropic etching which can reduce costs associated with forming moveable reflectors according to the present invention in comparison to conventional methods. In contrast to embodiments according to the present invention, DRIE may be used to form a recess which may require that the recess be formed prior to the moveable reflector. In contrast, in embodiments according to the present invention, the recess 1455 can be formed subsequent to the formation of the moveable reflector thereby reducing associated costs of manufacturing.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A microelectromechanical system (MEMS) structure comprising:
    a substrate;
    a recess in the substrate having a side wall and a floor; and
    a moveable reflector having a tail portion on the substrate extending beyond the side wall opposite the recess floor configured to rotate into the recess, and a head portion extending on the substrate outside the recess; and
    a hinge coupled to the moveable reflector and to the side wall to define an axis about which the moveable reflector is configured to rotate in a first direction into the recess to move the tail towards the side wall and to rotate in a second direction out of the recess to move the tail away from the side wall.

2. A MEMS structure according to claim 1 wherein the tail extends beyond a first portion of the side wall, the structure further comprising:
    a latch member on the substrate extending, opposite the floor, beyond a second portion of the side wall opposite the first portion of the side wall, wherein the latch member holds the head away from the substrate to define a wedge shaped gap between the head and the substrate opposite the head.

3. A MEMS structure according to claim 2 further comprising:
    a first electrode on the head; and
    a second electrode on the substrate opposite the head, wherein the wedge shaped gap changes in response to a voltage applied across the first and second electrodes.

4. A MEMS structure according to claim 1 wherein the tail extends beyond a first portion of the side wall and wherein the hinge applies a first force to the moveable reflector to rotate the head towards the substrate outside the recess, the structure further comprising:
    a latch member extending on the substrate opposite the floor from a second portion of the side wall opposite the first portion of the side wall, wherein a surface of the latch member that faces towards the floor contacts a surface of the tail that faces away from the floor to apply a second force to the moveable reflector opposite the first force to hold the head in a position away from the substrate.

5. A MEMS structure according to claim 4 wherein the moveable reflector is configured to rotate to a reflecting position wherein the tail contacts the side wall and the head is aligned with an optical radiation path parallel to the substrate in response to a magnetic force.

6. A MEMS structure according to claim 4 wherein the position comprises a first reflecting position to reflect incident optical radiation along a first reflected optical path, wherein the moveable reflector is configured to rotate the head towards the substrate to a second reflecting position separated from the substrate in response to an electrostatic force to reflect the incident optical radiation along a second reflected optical path.

7. A MEMS structure according to claim 5 further comprising:
    at least one raised structure on a surface of the tail that contacts the side wall and that keeps an adjacent portion of the surface from contacting the side wall.

8. A MEMS structure according to claim 7 further comprising:
    a first electrode on the side wall; and
    a second electrode on the surface of the tail that contacts the side wall opposite the first electrode, wherein the surface of the tail that contacts the side wall is clamped to the side wall in response to a voltage applied across the first and second electrodes.

9. A MEMS structure according to claim 7 wherein the substrate functions as a first electrode located on the side wall; and
    a second electrode on the surface of the tail that contacts the side wall opposite the first electrode, wherein the surface of the tail that contacts the side wall is clamped to the side wall in response to a voltage applied across the first and second electrodes.

10. A MEMS structure according to claim 2 wherein the latch comprises a material and the hinge comprises the material.

11. A MEMS reflector in an Optical Cross Connect (OXC) switch comprising:
    a substrate;
    a recess in the substrate having a side wall and a floor;
    a moveable reflector having a tail portion extending on the substrate beyond a first portion of the side wall opposite the recess floor configured to rotate into the recess and a head portion extending beyond the side wall on the substrate outside the recess;
    a hinge coupled to the moveable reflector and to the side wall to define an axis about which the moveable reflector is configured to rotate in a first direction into the recess to move the tail towards the side wall and to rotate in a second direction out of the recess to move the tail away from the side wall; and
    a latch member on the substrate extending opposite the floor beyond a second portion of the side wall opposite the first portion of the side wall to contact the tail, wherein the latch member holds the head away from the substrate to define a wedge shaped gap between the head and the substrate opposite the head.

12. A MEMS structure according to claim 11:
    wherein the hinge applies a first force to the moveable reflector to rotate the head towards the substrate outside the recess; and
    wherein a surface of the latch member that faces towards the floor contacts a surface of the tail that faces away from the floor to apply a second force to the moveable reflector opposite the first force to hold the head in a neutral position away from the substrate.

13. A MEMS structure according to claim 12 wherein the moveable reflector is configured to rotate to a reflecting position wherein the tail contacts the side wall and the head is aligned with an optical radiation path parallel to the substrate in response to a magnetic force.

14. A MEMS structure according to claim 12:
wherein the neutral position comprises a first reflecting position wherein the head is aligned with a first optical radiation path; and
wherein the moveable reflector is configured to rotate the head closer to substrate to a second reflecting position wherein the head is aligned with a second optical radiation path in response to an electrostatic force.

15. A MEMS structure according to claim 13 wherein the first reflecting position defines a first angle of about 18 degrees with the substrate and wherein the second reflecting position defines a second angle of about 12 degrees with the substrate.

16. A microelectromechanical system (MEMS) structure comprising:
a substrate;
a recess in the substrate having a side wall;
a moveable reflector on the substrate that pivots on the side wall and is cantilevered thereon to define a neutral position that avoids contact with the substrate; and
a latch member extending from the side wall opposite the moveable reflector, wherein the latch member contacts a portion of the moveable reflector to bias the moveable reflector into the neutral position.

17. A structure according to claim 16 wherein the neutral position defines a non-parallel shaped gap between the moveable reflector and the substrate.

18. A structure according to claim 17 wherein the non-parallel shaped gap comprises a wedge shaped gap.

19. A structure according to claim 16 wherein the neutral position comprises a mechanically biased position free of electromagnetic forces applied by the structure.

20. A structure according to claim 16 wherein the gap defines an angle of about 18 degrees with the substrate.

21. A method of forming a microelectromechanical system (MEMS) structure comprising:
forming a recess in a substrate, the recess having a side wall and a floor;
forming a moveable reflector having a tail portion on the substrate extending beyond the side wall opposite the recess floor and a head portion extending on the substrate beyond the side wall outside the recess; and
forming a hinge coupled to the moveable reflector and to the side wall to define an axis about which the moveable reflector is configured to rotate in a first direction into the recess to move the tail towards the side wall and to rotate in a second direction out of the recess to move the tail away from the side wall.

22. A method according to claim 21 wherein the tail extends beyond a first portion of the side wall, the method further comprising:
forming a latch member on the substrate extending, opposite the floor, beyond a second portion of the side wall opposite the first portion of the side wall, wherein the latch member holds the head away from the substrate to define a wedge shaped gap between the head and the substrate opposite the head.

23. A method according to claim 22 further comprising:
forming a first electrode on the head; and
forming a second electrode on the substrate opposite the head, wherein the wedge shaped gap changes in response to a voltage applied across the first and second electrodes.

24. A method according to claim 21 wherein the tail extends beyond a first portion of the side wall and wherein the hinge applies a first force to the moveable reflector to rotate the head towards the substrate outside the recess, the method further comprising:
forming a latch member extending on the substrate opposite the floor from a second portion of the side wall opposite the first portion of the side wall, wherein a surface of the latch member that faces towards the floor contacts a surface of the tail that faces away from the floor to apply a second force to the moveable reflector opposite the first force to hold the head in a position away from the substrate.

* * * * *